(12) United States Patent
Gergintschew

(10) Patent No.: US 7,339,773 B2
(45) Date of Patent: Mar. 4, 2008

(54) METHOD FOR DRIVING A SEMICONDUCTOR SWITCH AND CIRCUIT CONFIGURATION WITH A SEMICONDUCTOR SWITCH

(75) Inventor: Zenko Gergintschew, München (DE)

(73) Assignee: Infineon Technologies AG, Munich (DE)

( * ) Notice: Subject to any disclaimer, the term of this patent is extended or adjusted under 35 U.S.C. 154(b) by 318 days.

(21) Appl. No.: 10/675,050

(22) Filed: Sep. 30, 2003

(65) Prior Publication Data

US 2004/0070910 A1    Apr. 15, 2004

(30) Foreign Application Priority Data

Sep. 30, 2002   (DE)   ................ 102 45 484

(51) Int. Cl.
| | |
|---|---|
| *H02H 9/00* | (2006.01) |
| *H02H 3/08* | (2006.01) |
| *H02H 9/02* | (2006.01) |
| *H02H 9/08* | (2006.01) |
| *H02H 3/00* | (2006.01) |
| *H02H 7/00* | (2006.01) |
| *H02H 5/04* | (2006.01) |

(52) U.S. Cl. ............. 361/58; 361/93.1; 361/93.7; 361/93.9; 361/100; 361/103

(58) Field of Classification Search ........... 361/93.7, 361/93.9
See application file for complete search history.

(56) References Cited

U.S. PATENT DOCUMENTS

| 5,187,632 A | 2/1993 | Blessing | |
|---|---|---|---|
| 5,373,205 A * | 12/1994 | Busick et al. | 327/378 |
| 5,757,203 A * | 5/1998 | Brown | 324/765 |
| 6,052,268 A * | 4/2000 | Thomas | 361/103 |
| 6,781,357 B2 * | 8/2004 | Balakrishnan et al. | 323/282 |

FOREIGN PATENT DOCUMENTS

EP    0 373 694 A1    6/1990

OTHER PUBLICATIONS

Infineon Technologies AG: "PROFET Data Sheet BTS 443 P", dated Jan. 23, 2001, pp. 1-13.

* cited by examiner

*Primary Examiner*—Michael Sherry
*Assistant Examiner*—Dharti H Patel
(74) *Attorney, Agent, or Firm*—Laurence A. Greenberg; Werner H. Stemer; Ralph E. Locher

(57) ABSTRACT

A method for driving a semiconductor switch with load current limiting and thermal protection whose maximum load current is limited and which switches off when a predetermined upper temperature is exceeded and switches on again when a predetermined lower temperature is crossed. The semiconductor switch is operated in a normal mode and a fault mode. The semiconductor switch is driven in the fault mode once the predetermined temperature is exceeded; and the load current is limited to a first maximum value in a normal mode and a second maximum value, which is lower than the first maximum value, in a fault mode. Such a circuit configuration with a semiconductor switch has a protection circuit and a sensor circuit.

7 Claims, 6 Drawing Sheets

METHOD FOR DRIVING A SEMICONDUCTOR SWITCH AND CIRCUIT CONFIGURATION WITH A SEMICONDUCTOR SWITCH

BACKGROUND OF THE INVENTION

FIELD OF THE INVENTION

The invention relates to a method for driving a semiconductor switch with load current limitation and thermal protection, whose maximum load current is limited and which switches off when a predetermined upper temperature is exceeded and switches on again when the temperature falls below a predetermined lower temperature, and to a circuit configuration with a thermally protected semiconductor circuit.

Semiconductor switches for load switching, i.e. for applying a load which is connected in series with the load path of a semiconductor switch to a supply voltage, are utilized in a wide variety of fields, among them the automotive field. In some of the known commercial semiconductor switching modules, in addition to the actual semiconductor switch, for instance a power MOSFET or power IGBT, there are protective circuits for guarding the semiconductor switch against overload, particularly against excessive temperature or excessive load current, integrated therein. Such switching modules are known to the person skilled in the art as smart power switches or smart power ICs.

A switching module having a power MOSFET, a current sensor and a temperature sensor is described, for example, in the Data Sheet of the Component BTS 443 P, dated Jan. 23, 2001 of Infineon Technologies AG, Munich.

A switching module having a semiconductor switch and an overtemperature protection circuit as well as an overcurrent protection circuit for the semiconductor switch is also described in U.S. Pat. No. 5,187,632.

A known technique for protecting the semiconductor switch or other circuit parts in such integrated circuits from excess temperature is to integrate a temperature sensor into the switching module and to evaluate a signal that is delivered by the temperature sensor. If the temperature exceeds a predetermined threshold value, the power transistor is shut off by a protective circuit in order to lower the power consumption of the power module and prevent further heating of the power module. As to the reactivation of the power transistor following such a temperature-related deactivation, there is a distinction between switching modules in which the reactivation is dependent on an external command (latch principle) and those in which it occurs automatically once the switching module cools below a predetermined temperature (restart principle). The advantage of the restart principle is that the switching module reactivates—i.e. returns to the previous operating mode—after cooling, without requiring any external outlay. The disadvantage of the restart principle is that, if the circuit module is overheating due to a shorting of the load, the power transistor is switched on again in short-circuit conditions again, with the result that the temperature in the switching module rises again owing to the large amount of power that gets converted in the switching module as a consequence of the short, until the upper temperature threshold is reached again and the power transistor is consequently deactivated again. In a switching module with load current limitation, the load current constantly reaches the maximum upper temperature limit under these operating conditions.

The average power that is converted into heat in the semiconductor module during a short can be reduced when the overcurrent limiting begins with smaller currents and therefore limits the maximum load current to lower values. However, it must be taken into account that these switching modules are frequently employed for switching capacitive loads of lamps or electromotors, which have a relatively high initial current that must never lead to the semiconductor switch being turned off as if a failure were occurring. For example, in automotive applications, a basic limiting of the maximum allowable temperature to a lower value is constrained by the fact that temperatures of up to 150° C. arise in switching modules there during normal operation, which must not bring about a temperature-related shutdown.

SUMMARY OF THE INVENTION

It is accordingly an object of the invention to provide a method for driving a semiconductor switch and a circuit configuration which overcome the above-mentioned disadvantages of the prior art methods and devices of this general type, with which the power that is converted into heat in the event of a load short in the semiconductor switch is reduced compared to conventional semiconductor switches.

With the foregoing and other objects in view there is provided, in accordance with the invention, a method for driving a semiconductor switch having load current limiting and thermal protection. A maximum load current is limited and the semiconductor switch switches off upon a predetermined upper temperature being exceeded and switches on again when a chip temperature falls below a predetermined lower temperature. The method includes operating the semiconductor switch in a normal mode or a fault mode, operating the semiconductor switch in the fault mode upon exceeding the predetermined upper temperature, and limiting a load current to a first maximum value in the normal mode and to a second maximum value, being lower than the first maximum value, in the fault mode.

The inventive method for driving the semiconductor switch with load current limitation and thermal protection whose maximum load current is limited, which is switched off when a predetermined upper temperature is exceeded and switched on again when the temperature falls below a predetermined lower temperature, provides that the semiconductor switch be operated in a normal mode and a fault mode. The semiconductor switch is operated in the fault mode once the temperature rises above the predetermined upper temperature, the difference between the normal and fault modes being the maximum load current at which the current limiting begins. In the normal mode, the load current is limited to a first maximum value, and, in the fault mode, the load current is limited to a second maximum value which is lower than the first.

The lower of these two load current limit values, which pertains to the fault mode, is selected so that the loads with the lowest impedance for which the semiconductor switch is specified can still be supplied.

Regardless of the operating mode, the semiconductor switch is switched on again when the temperature drops below a lower threshold value.

In this method, given a persistent short, a lower maximum current flows through the semiconductor switch during the fault mode than during the normal mode. The circuit configuration with the semiconductor switch is thus heated more slowly and gently, which reduces the temperature-related stress in the semiconductor material and the surrounding housing.

When in the fault mode, the semiconductor switch is switched off upon exceeding a second upper temperature which is lower than the first upper temperature. As a result, a temperature-related deactivation occurs at lower maximum temperatures than in normal mode. As a result, the semiconductor switch, or an integrated circuit in which the semiconductor switch is integrated, is likewise under a lower temperature-related stress in the event of a fault, i.e. given a short of the load or an overload.

According to the inventive method, the voltage across the load path of the semiconductor switch is also evaluated, the semiconductor switch being operated in the normal mode again, after a transition into the fault mode, when the voltage across the load path of the semiconductor switch has dropped below a predetermined threshold value. The dropping of the load path voltage indicates that the voltage across the load has increased, which indicates that the short that constituted the fault has ended.

The inventive circuit configuration contains a semiconductor switch with an drive terminal and a load path, a protective circuit that is connected to the drive terminal of the semiconductor circuit, a load current sensor that provides a load current signal, and a temperature sensor that is disposed in the region of the semiconductor switch and provides a temperature measuring signal, the temperature signal and the load current signal being supplied to the protective circuit. In the protective circuit, a first and a second overcurrent signal are available, the protective circuit being capable of assuming a first or second switching state, and, depending on the state, the protective circuit switches off the semiconductor switch in accordance with a comparison of the current signal with the first overcurrent signal or in accordance with a comparison of the current signal with the second overcurrent signal.

There are also first and second overtemperature signals available in the protective circuit, whereby, depending on the state, the protective circuit drives the semiconductor switch into a blocking state in accordance with a comparison of the temperature signal with the first overtemperature signal or in accordance with a comparison of the temperature signal with the second overtemperature signal.

The circuit configuration advantageously contains a voltage measuring configuration for detecting a load path voltage of the semiconductor switch, which provides a voltage measuring signal which is supplied to the protective circuit, the circuit assuming one of the two switching states depending on the voltage measuring signal.

Other features which are considered as characteristic for the invention are set forth in the appended claims.

Although the invention is illustrated and described herein as embodied in a method for driving a semiconductor switch and a circuit configuration with a semiconductor switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
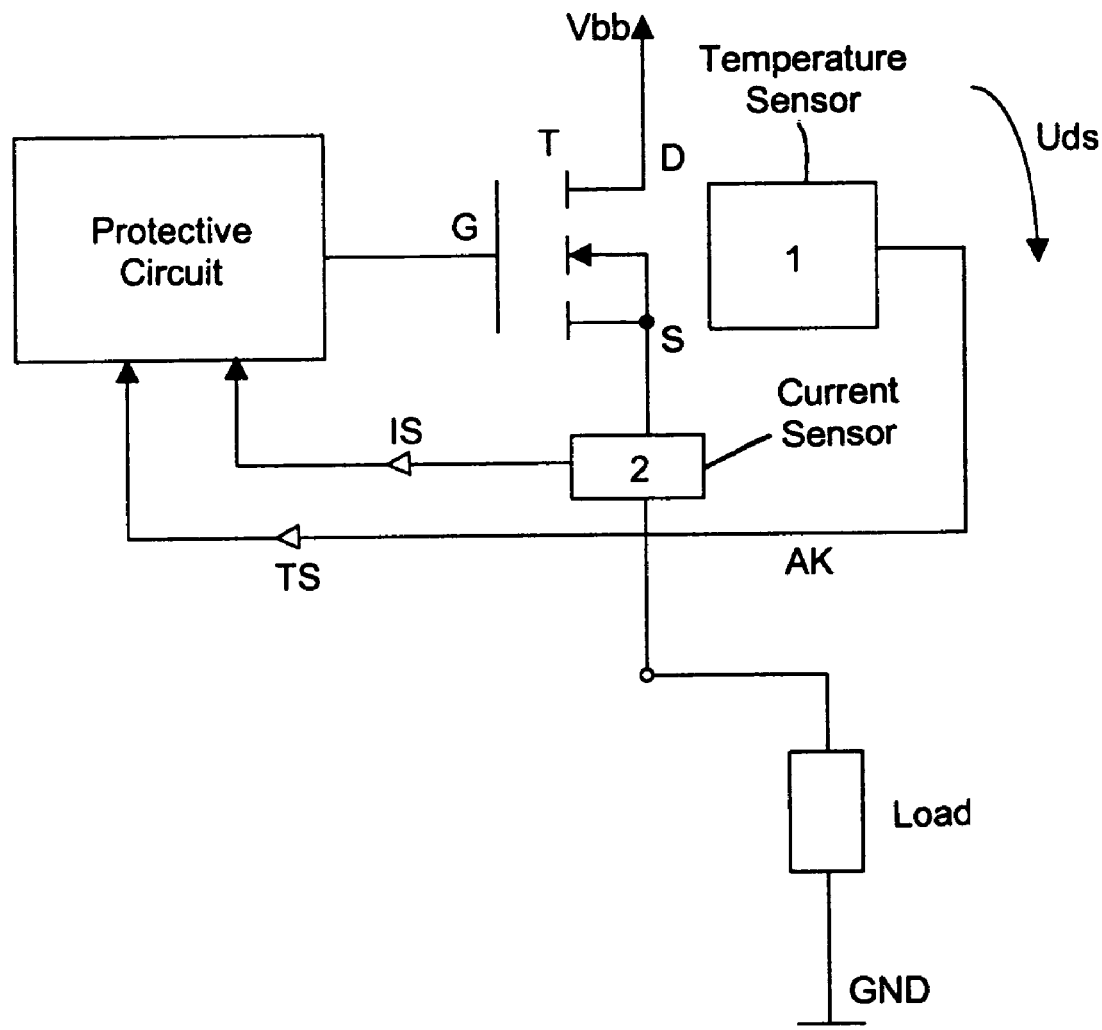
FIG. 1 is a block diagram of a circuit configuration with a semiconductor switch and a control circuit according to the prior art.
Figure 2A:
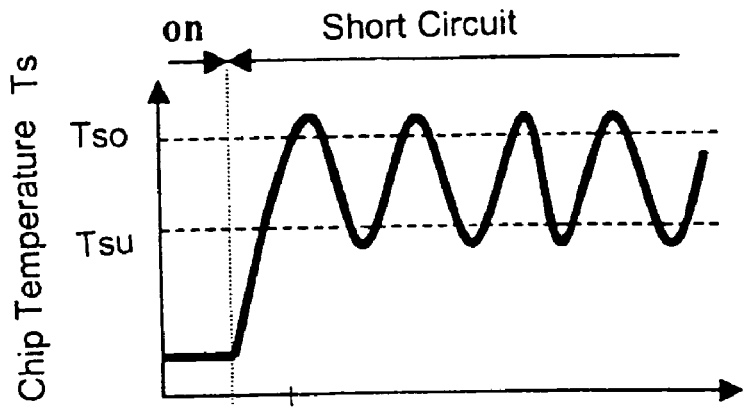
FIGS. 2A-2D are graphs showing selected measurement values of the semiconductor switch in a drive method according to the prior art.
Figure 2B:
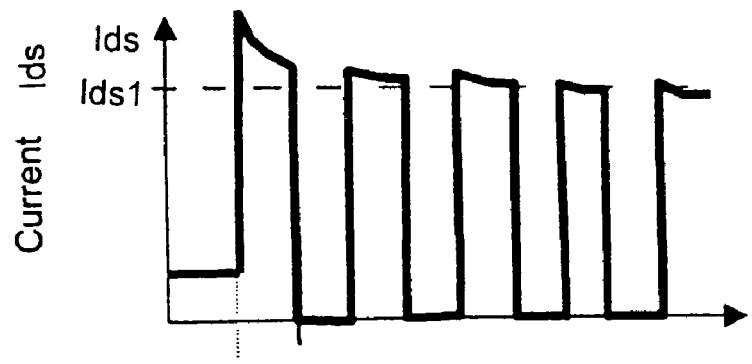
Figure 2C:
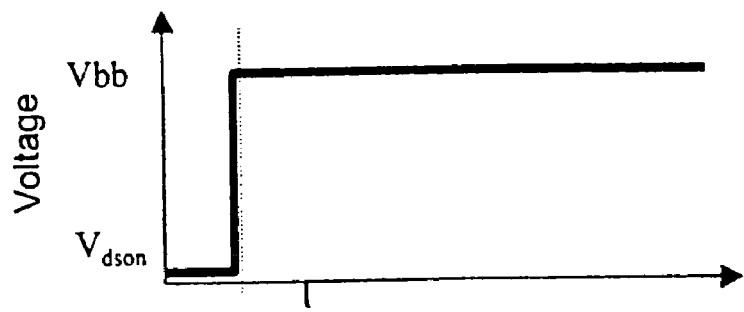
Figure 2D:
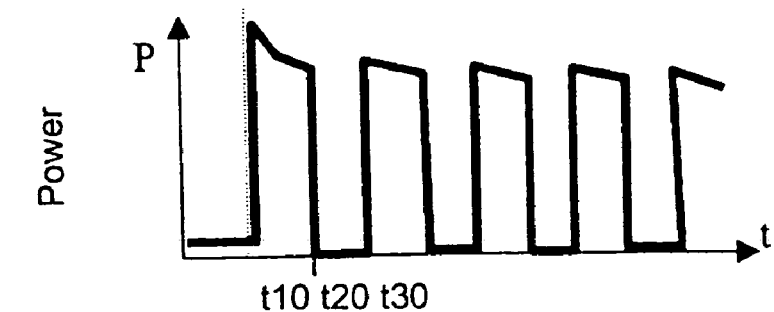

In all the figures of the drawing, sub-features and integral parts that correspond to one another bear the same reference symbol in each case. Referring now to the figures of the drawing in detail and first, particularly, to FIG. 1 thereof, there is shown a schematic representation of the structure of a conventional switching module with a power transistor D whose drain-source path is connected in series with a load, the series circuit with the power transistor and the load being connected between a terminal for supply potential Vbb and a terminal for a reference potential GND. The switching module contains a temperature sensor 1 in the region of the power transistor T, which supplies a temperature signal TS to a protective circuit, which shuts off (blocks) the power transistor T given excess temperature. The switching module further contains a current sensor 2, which detects a load current Ids through the power transistor T and supplies a current signal IS to the protective circuit. The current sensor 2 is schematically connected in series with the load in FIG. 1 but can be configured any other way. For instance, the current sensor can function according to the current sense principle, according to which the load current through a cellular transistor is detected by detecting the current through cells parallel to the cells that are passed by the load current.

The functioning of such a switching module given the occurrence of a short circuit in the load will be briefly elaborated in connection with FIGS. 2A-2D. FIGS. 2A-2D represent time curves of the chip temperature, or rather a temperature signal TS that is dependent on the chip temperature, the load current Ids, a voltage Uds across the load path D-S of the power transistor T, and the power P that is converted into heat in the power transistor. The representation according to FIGS. 2A-2D is based on the assumption that a short occurs in the load at time t10. At this instant, the voltage Uds across the load path D-S rises abruptly approximately to the value of the supply voltage Vbb. The load current Ids through the power transistor rises with corresponding steepness until it attains the upper limit value. As a result of the voltage rise and the current rise, the power P that is converted into heat in the power transistor also rises steeply, which leads to heating of the power module, which is typically constructed as an integrated circuit. In order to limit the load current in the event of a short, the power transistor T is reset as soon as the load current Ids exceeds a predetermined current threshold Idsl for the purpose of limiting the maximum load current Ids to a value in the region of this current threshold Idsl.

If the chip temperature exceeds an upper temperature threshold TSo as a result of the short circuit, the power transistor T is blocked by the protective circuit, as a result of which the load circuit Ids, and with it the power P that gets converted into heat, drop to zero, as represented at time t20. As a result of the deactivating of the power transistor, the temperature of the module drops until it falls below a lower temperature threshold TSu at time t30 and the power transistor is automatically switched on again. As long as the short still exists, the load current Ids rises steeply again, dropping to zero again as a result of the blocking of the power transistor D only when the chip temperature TSo rises above the upper temperature threshold value. The repeated actuating under short conditions leads to degenerative effects in the module as a result of the high currents and the related high temperatures and particularly the high temperature gradients, which effects harm the semiconductor chip itself as well as its housing and thus impair the lifetime of the modules or at least the stability of their operating parameters.

FIGS. 3A-3D show the time characteristic of selected measurement values of the semiconductor switch T or a circuit configuration with the semiconductor switch T in an embodiment of a method for driving the semiconductor switch according to the invention. FIGS. 3A-3D shows the time characteristics of the chip temperature or a temperature signal TS that is directly related to the chip temperature, the load current Ids, the load path voltage Uds, and the power P that is converted into heat in the semiconductor switch T.

The signal curve represented in FIGS. 3A-3D is based on the assumption that the semiconductor switch T is operated without a fault until time t1. At time t1 a short circuit occurs in a load that lies in series with the semiconductor switch, as a result of which the load current Ids through the semiconductor switch rises steeply. With the load current, the power that is converted into heat in the semiconductor switch also rises, and with that the chip temperature in the semiconductor body in which the semiconductor switch is integrated. The semiconductor switch is operated with a current limitation; that is, the maximum load current cannot exceed an upper threshold IS1 even in the event of a short of the load; that is to say, upon the crossing of the upper threshold value, the load current is reset to the threshold value IS1 by the opening of the semiconductor switch, as can be seen in the current curve between times t1 and t2.

In the inventive method, the semiconductor switch is turned off when the chip temperature exceeds the upper maximum value, i.e. when the temperature signal TS that is dependent on the chip temperature exceeds an upper maximum value TS1, as occurs at time t2. With the opening of the semiconductor switch T, the load current Ids and the power P that is converted into heat in the semiconductor switch T return to zero.

With the opening of the semiconductor switch due to exceeding the upper maximum value TS1, the semiconductor switch transitions into a fault mode in which the semiconductor switch is subsequently driven. The fault mode differs from the normal mode based on a lower limit value for the maximum allowable load current, which is explained below.

When the temperature measurement value TS falls below a lower threshold value TS3 at time t3, the semiconductor switch T is switched on again, whereupon the maximum allowable load current is limited to a second maximum value IS2 which is lower than the first maximum value IS1. The effect is that, if there is still a short of the load, less power P is converted into heat in the semiconductor switch T owing to the low maximum current, and the chip temperature rises more slowly, the semiconductor switch being switched off again when the temperature signal TS exceeds the upper maximum value TS1 during fault mode also, as is the case at time t4, for example.

Figure 3A:
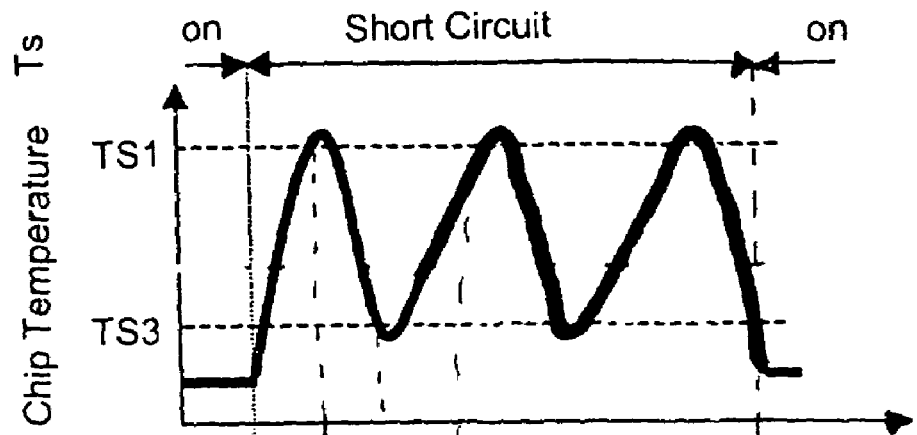
FIGS. 3A-3D are graphs showing selected measurement values of the semiconductor switch for illustrating a first embodiment of a method for driving the semiconductor switch according to the invention.
Figure 3B:
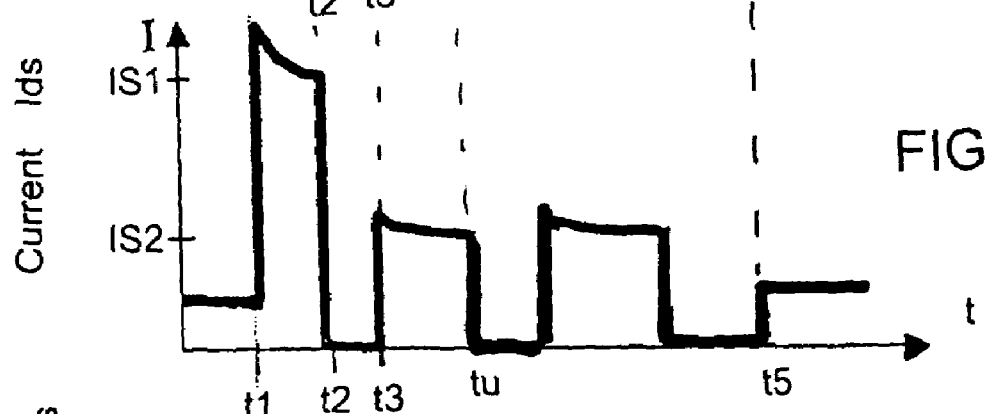
Figure 3C:
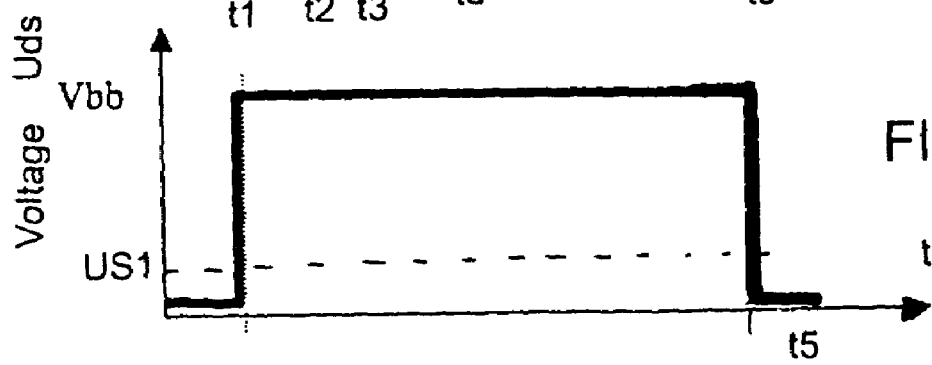
Figure 3D:
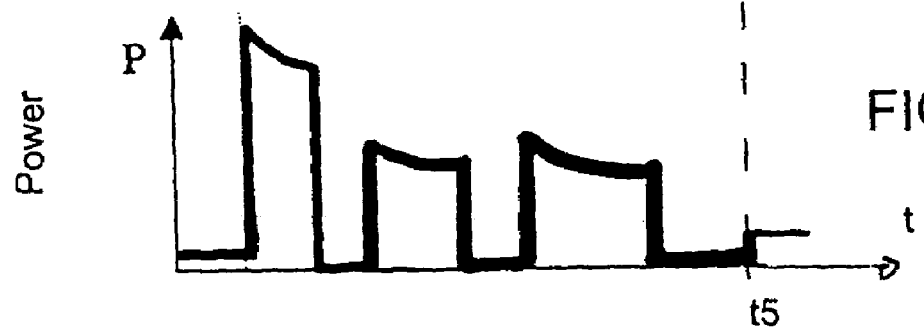
Figure 4A:
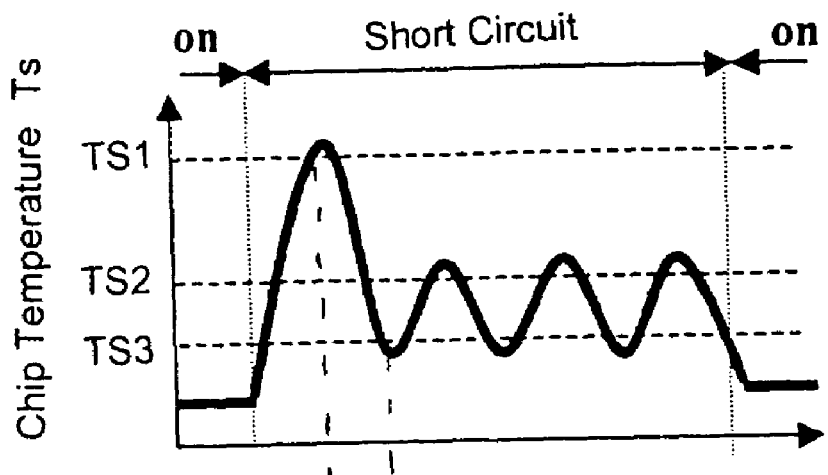
FIGS. 4A-4D are graphs showing selected measurement values of the semiconductor switch for illustrating a second embodiment of a method for driving the semiconductor switch according to the invention.
Figure 4B:
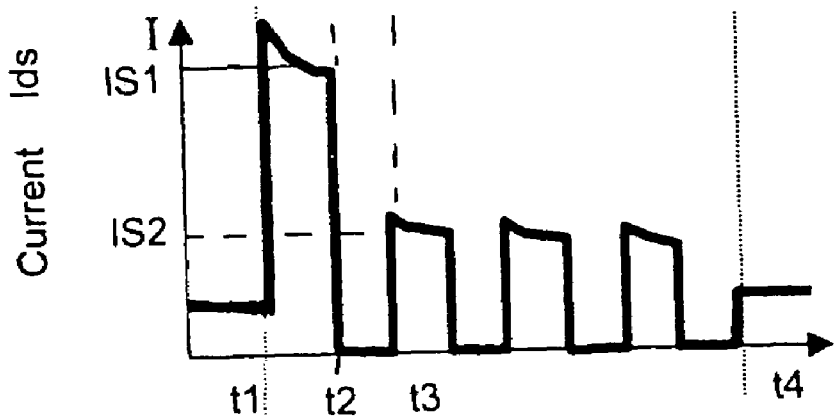
Figure 4C:
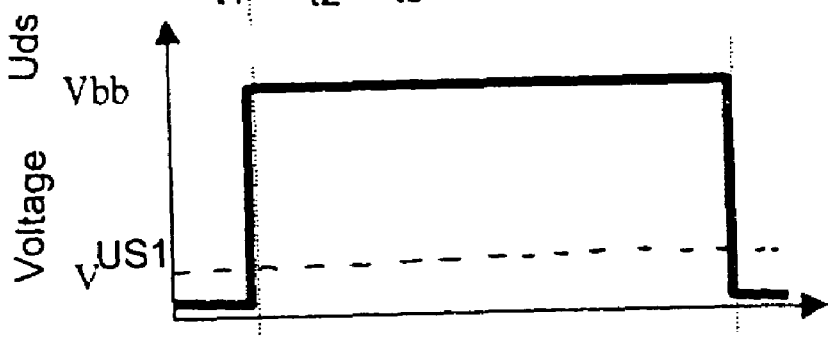
Figure 4D:

The semiconductor switch is driven in the normal mode again only when there is no longer a short in the load. In order to detect this, the voltage Uds across the load path of the semiconductor switch T is detected. During the short, approximately the entire supply voltage Vbb across the series circuit containing the semiconductor switch and the load drops across the load path of the semiconductor switch T. After the elimination of the short, the load path voltage Uds drops substantially, because the majority of the voltage is across the load again. An embodiment of the invention therefore provides that the load path voltage Uds is monitored, and that the semiconductor switch T is driven in the normal mode again—i.e. the load current is limited to the higher value IS1—once the load path voltage Uds drops below a predetermined threshold value during fault mode, which is represented in FIG. 3C at time t5.

FIGS. 4A-4D show time curves of the measurement values that were described in connection with FIGS. 3A-3D, in an embodiment of the inventive method in which not only the maximum allowable load current Ids is limited to a lower value IS2 during fault mode, but also the maximum allowable temperature is limited to a lower temperature, which is represented by a temperature signal TS2. Like in the method according to FIGS. 3A-3D, in the method according to FIGS. 4A-4D the semiconductor switch switches over to fault mode at time t2, at which the temperature signal TS1 which is dependent on the chip temperature crosses beyond the first maximum temperature value TS1, whereupon the semiconductor switch is switched off at the time t2. The semiconductor switch is switched on again when the chip temperature falls below a lower limit value TS3 as represented at time t3. If there is still a short in the load, the chip temperature then rises again, but the temperature rise is slowed, because the maximum allowable load current is limited during fault mode to a value IS2 that is lower than the value IS1 that is critical during normal mode.

Furthermore, during the fault mode, the semiconductor switch is switched off again once the temperature measuring signal TS rises to a second maximum value TS2 that is smaller than the first maximum value TS1. The effect of the load limitation to the lower value IS2 during fault mode is that less power is converted into heat in the on state of the semiconductor switch. The effect of the temperature limitation to the lower value TS2 is that the on-times during fault mode are shorter, and the chip with the semiconductor switch is not heated as strongly.

From time t4, the semiconductor switch is driven in the normal mode again, in which the load current limitation is based on the higher limit value IS1 and the temperature limitation is likewise based on the higher limit value TS1, once the load path voltage Uds falls below a predetermined limit value indicating that the short has ended.

Figure 5:
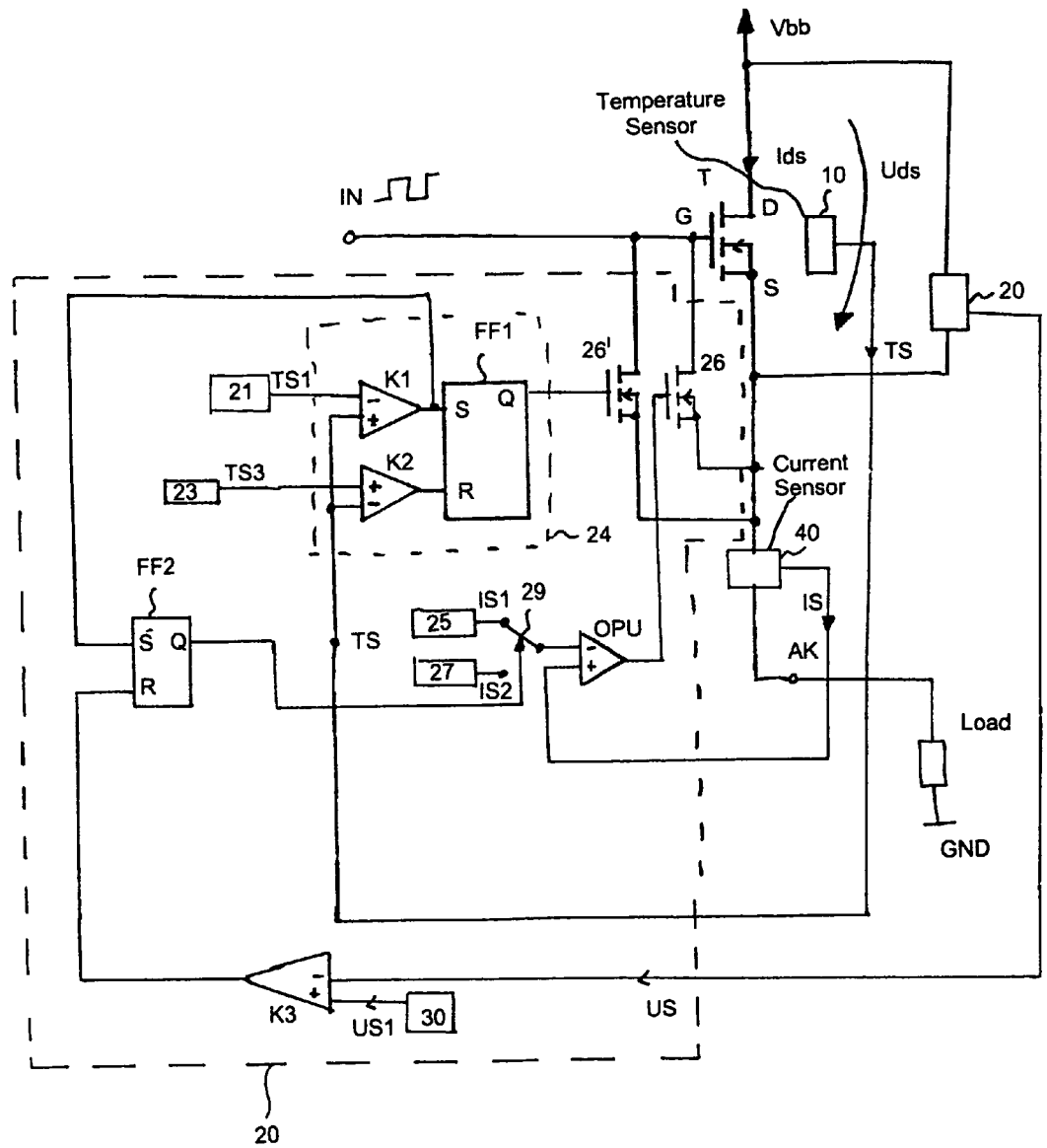
FIG. 5 is a circuit diagram of a first exemplifying embodiment of an inventive circuit configuration with the semiconductor switch.

FIG. 5 represents a first exemplifying embodiment of an inventive circuit configuration with the semiconductor switch T, in this case an n-channel MOSFET, whose drain-source path is connected in series with a load, there being a supply voltage Vbb pending across the series circuit of the semiconductor switch T and the load. The semiconductor switch T is integrated in a semiconductor module, for example, a source terminal S of the semiconductor switch T in this case forming an output terminal AK of the semiconductor module for connecting the load.

The semiconductor switch T conducts and blocks according to a drive signal IN' at its gate terminal G, which is provided by a known driver circuit. The driver circuit contains a charge pump for producing a drive potential that is suitable for driving the semiconductor switch T, which serves as a high-side switch, into a conductive state.

The circuit configuration further contains a protective circuit 20, which protects the semiconductor switch T from a temperature overload and a current overload. A temperature signal TS is supplied to the protective circuit 20, which signal is provided by the temperature sensor 10 that is disposed in the region of the semiconductor switch T as represented in FIG. 5. Technologically, the temperature sensor 10 is advantageously integrated in the same semiconductor body in which the semiconductor switch T is also integrated, specifically in the cell field of the generally cellular semiconductor switch.

For detecting the load current Ids through the semiconductor switch T, a current sensor 40 is provided, which is connected in series with the load path D-S of the semiconductor switch T in the exemplifying embodiment according to FIG. 5. The current sensor 40 can be realized in any form. Particularly, the current sensor 40 can be realized according to what is known as the current sense principle; i.e., some of the cells of the cellular semiconductor switch T can be used for the current detection. The current sensor 40 provides a current signal IS which is also fed to the protective circuit 20.

The protective circuit 20 is constructed for turning off (blocking) the semiconductor switch T when the temperature signal TS exceeds an upper maximum value. The protective circuit 20 is also configured to drive the semiconductor circuit T such that the load current Ids is limited to a maximum value.

The protective circuit 20 has a control loop with an operational amplifier OPV and a transistor 26 provided for regulating the load current. The transistor 26 is connected between the gate terminal G and the source terminal S of the semiconductor switch T. The transistor 26 is driven by the operational amplifier OPV in dependence on a comparison of the current measurement signal IS with a first or second current limit value IS1, IS2, the first and second current limit values IS1, IS2 being available in the protective circuit 20 and stored in storage devices 25, 27, for example. In the represented exemplifying embodiment, the first current limit value IS1 or the second current limit value IS2 is supplied to the minus input of the operational amplifier OPV depending on a setting of switch 29, for the purpose of comparing the current measurement value IS with one of these two current limit values IS1, IS2 and driving the transistor 26.

If the current measurement value IS exceeds the limit value IS1, IS2 presently applied at the operational amplifier OPV, the operational amplifier OPV drives the transistor 26 to shut down the power transistor T so that the load current Ids is limited.

The thermal protective circuit contains an additional transistor 26' whose drain-source path is also connected between the gate terminal G and the source terminal S of the power transistor T, and which is driven by a comparison circuit 24 that is supplied with the temperature measuring signal TS and a first upper temperature limit value TS1 and a lower temperature limit value TS3. The comparison circuit 24 is configured to drive the transistor 26' into a conductive state in order thereby to block the semiconductor switch when the temperature signal TS exceeds the upper limit value TS1, and to block the transistor 26', thereby making it possible to drive the semiconductor switch T into a conductive state based on the input signal IN, when the temperature signal TS falls below the lower temperature limit TS3. To that end, the comparator configuration 24 contains first and second comparators K1, K2, the upper temperature signal TS1 being supplied to the minus input of the first comparator K1, and the lower temperature limit signal TS3 being supplied to the plus input of the second comparator K2. The temperature measuring signal TS is supplied to the respective other inputs of the comparators K1, K2.

The transistor 26' is driven by an RS flip-flop FF1, a set input S of the flip-flop FF1 being supplied with an output signal of the first comparator K1, and the reset input R of the flip-flop FF1 being supplied with the output signal of the second comparator K2. The flip-flop FF1 is set for the purpose of driving the transistor 26' into a conductive state when the temperature signal TS exceeds the upper temperature limit signal TS1, and the flip-flop FF1 is reset for the purpose of blocking the transistor 26' again when the temperature limit signal TS subsequently falls below the lower temperature limit signal TS3.

Depending on which current limit value IS1, IS2 is applied for load current limitation, the protective circuit 20 is operated in a first mode, henceforth a normal mode, or a second mode, henceforth a fault mode. The normal mode is characterized by the application of the first current limit signal IS1, which is larger than the second current limit signal IS2, for load current limitation.

The switch 29 across which one of the two current limit signals IS1, IS2 is supplied to the operational amplifier OPV, is driven by a second RS flip-flop FF2, whose switch state determines the operating mode of the protective circuit 20. When the flip-flop FF2 is in reset position, the protective circuit 20 functions in the normal mode, and the switch 29 is in a position in which the first current limit signal IS1 is fed to the operational amplifier OPV. When the flip-flop FF2 is in set position, the protective circuit is in fault mode, and the second current limit signal IS2 is fed across the switch 29 to the operational amplifier OPV for the load current limitation of the semiconductor switch T. The flip-flop FF2 is set when, according to the output signal of the comparator K1, the temperature signal TS exceeds the value of the upper temperature limit signal TS1, the temperature limit signal TS1 being selected such that the temperatures corresponding to the limit signal TS1 are only reached in the event of a fault, for instance when a short occurs in the load. The protective circuit 20 thus changes over into fault mode when the temperature exceeds a limit value defined by the upper temperature signal TS1, the load current being limited during fault mode to a lower value that is defined by the second current limit signal IS2.

Figure 6:
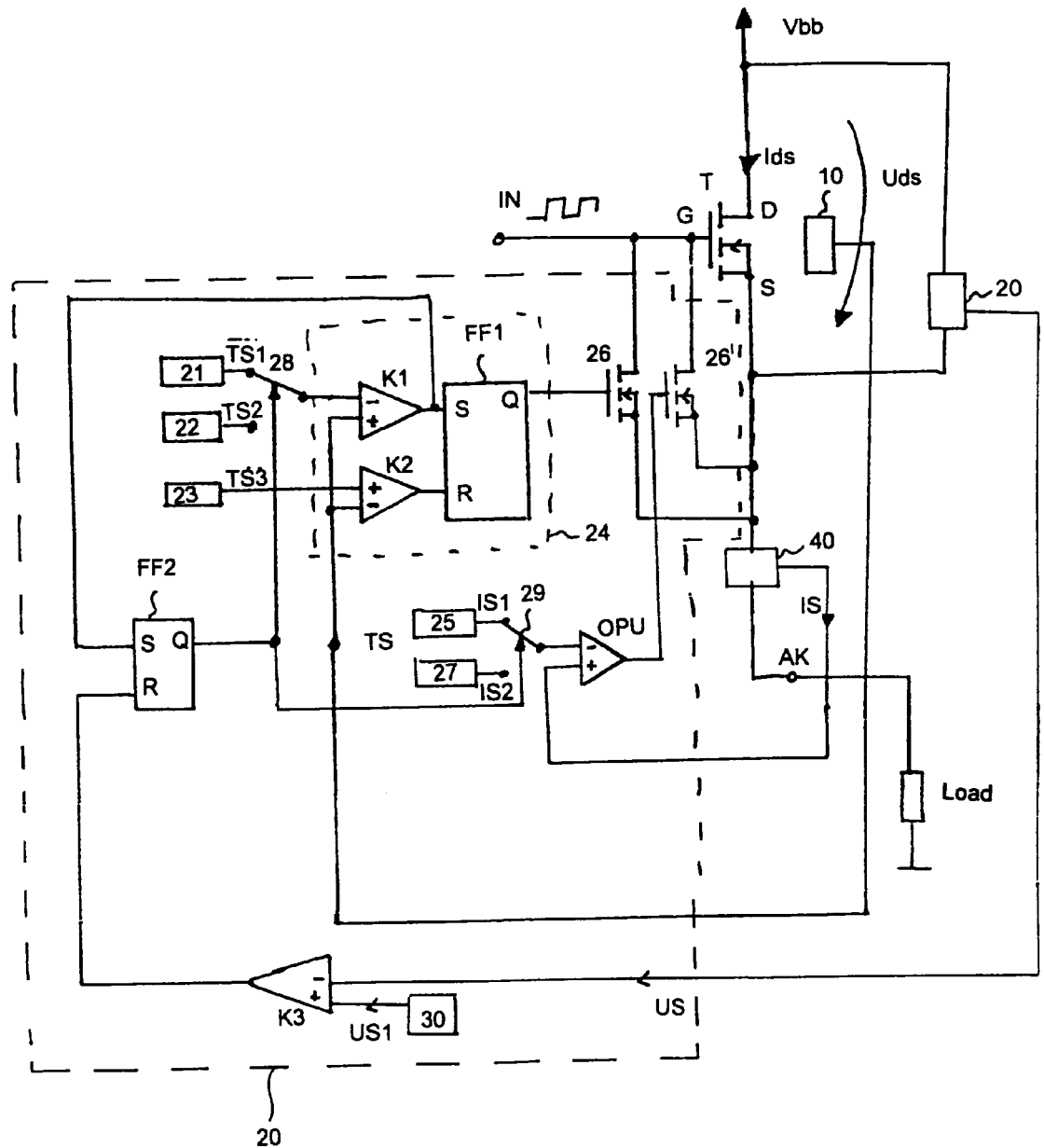
FIG. 6 is a circuit diagram of a second exemplifying embodiment of the inventive circuit configuration with the semiconductor switch.

FIG. 6 represents a modification of the circuit configuration represented in FIG. 5, a second temperature limit signal TS2 being available in the protective circuit 20 in this embodiment in addition to the first temperature limit signal TS1, the temperature limit signals TS1, TS2 being stored in storage devices 21, 22. The second temperature limit signal TS2 is lower then the first temperature limit signal TS1. The two temperature limit signals TS1, TS2 are fed to the comparator K1 according to the setting of a switch 28, which, like the switch 29, is driven by the second flip-flop FF2. The switch status of the flip-flop FF2 and the setting of the switch 28 are tuned to one another in such a way that, in normal mode, i.e. when the flip-flop FF2 is in reset position, the first temperature limit signal TS1 is fed to the comparator K1 in order to block the semiconductor switch T if the temperature signal TS should exceed the first temperature limit signal TS1. When the flip-flop FF2 is in set position, the protective circuit 20 is in the fault mode, and the second temperature limit signal TS2 is fed to the comparator K2 across the switch 28, so that during the fault mode it blocks the semiconductor switch T once the temperature signal TS exceeds the second temperature limit signal TS2. In the circuit configurations according to FIGS. 5 and 6, in order to reset the second flip-flop FF2, i.e. to transfer the protective circuit 20 from the fault mode into the normal mode, the load path voltage Uds across the load path D-S of the semiconductor switch T is monitored. The load path voltage Uds is detected by a voltage measuring configuration 20 that provides a voltage measuring signal US. The voltage measuring signal US is compared by a comparator K3 to a voltage reference signal US1 that is available in the protective circuit 20, for instance being stored in a memory 20, and the flip-flop FF2 is reset when the voltage measuring signal US falls below the value of the reference signal US1. A drop in the load path voltage Uds below the reference value US1 indicates the absence of a short of the load, whereas when a short occurred, the temperature rose and the protective circuit 20 was switched into fault mode.

I claim:

1. A method for driving a semiconductor switch having load current limiting and thermal protection, a maximum load current being limited and the semiconductor switch switching off upon a predetermined upper temperature being exceeded and switching on again when a chip temperature falls below a predetermined lower temperature, which comprises the steps of:
   operating the semiconductor switch in one of a normal mode and a fault mode;
   operating the semiconductor switch in the fault mode upon exceeding the predetermined upper temperature;
   limiting a load current to a first maximum value in the normal mode and to a second maximum value, being lower than the first maximum value and being greater then zero, in the fault mode; and
   switching on the semiconductor switch when the chip temperature falls below the predetermined lower temperature in the normal mode and in the fault mode.

2. A method for driving a semiconductor switch having load current limiting and thermal protection, a maximum load current being limited and the semiconductor switch switching off upon a predetermined upper temperature being exceeded and switching on again when a chip temperature falls below a predetermined lower temperature, which comprises the steps of:
   operating the semiconductor switch in one of a normal mode and a fault mode;
   operating the semiconductor switch in the fault mode upon exceeding the predetermined upper temperature;
   limiting a load current to a first maximum value in the normal mode and to a second maximum value, being lower than the first maximum value, in the fault mode; and
   switching off the semiconductor switch, when in the fault mode, if a further upper temperature is exceeded, the further upper temperature is lower than the predetermined upper temperature.

3. The method according to claim 1, which further comprises limiting the load current by actuating the semiconductor switch.

4. The method according to claim 1, which further comprises:
   monitoring a voltage across a load path of the semiconductor switch; and
   operating the semiconductor switch in the normal mode when a load path voltage is smaller than a predetermined threshold value.

5. A circuit configuration, comprising:
   a semiconductor switch having a drive terminal and a load path;
   a protective circuit connected to said drive terminal of said semiconductor switch;
   a temperature sensor disposed in a region of said semiconductor switch and coupled to said protective circuit, said temperature sensor providing a temperature measuring signal fed to said protective circuit; and
   a current measuring configuration coupled to said protective circuit and generating a current measuring signal being dependent on a current across said load path of said semiconductor switch;
   said protective circuit storing first and second overcurrent signals, said protective circuit assuming one of a first operating mode and a second operating mode, and, depending on a mode, said protective circuit controlling said semiconductor switch according to a comparison of the current measuring signal to the first overcurrent signal or according to a comparison of the current measuring signal to the second overcurrent signal.

6. The circuit configuration according to claim 5, wherein said protective circuit stores first and second overtemperature signals, and, depending on the mode, said protective circuit drives said semiconductor switch into a blocking state according to a comparison of the temperature measuring signal to the first overtemperature signal or according to a comparison of the temperature measuring signal to the second overtemperature signal.

7. The circuit configuration according to claim 5, further comprising a voltage measuring configuration for detecting a load path voltage of said semiconductor switch and connected to said protective circuit, said voltage measuring configuration providing a voltage measuring signal that is fed to said protective circuit, said protective circuit assumes one of the first and second modes depending on the voltage measuring signal.

* * * * *